United States Patent
Ojima et al.

(10) Patent No.: US 11,852,092 B2
(45) Date of Patent: Dec. 26, 2023

(54) ELECTRIC CURRENT DETECTION APPARATUS

(71) Applicant: AISIN CORPORATION, Aichi (JP)

(72) Inventors: Kouki Ojima, Kariya (JP); Satoshi Sakai, Kariya (JP); Toshihisa Habiro, Kariya (JP); Yuta Kawai, Kariya (JP)

(73) Assignee: AISIN CORPORATION, Aichi (JP)

( * ) Notice: Subject to any disclaimer, the term of this patent is extended or adjusted under 35 U.S.C. 154(b) by 323 days.

(21) Appl. No.: 17/385,274

(22) Filed: Jul. 26, 2021

(65) Prior Publication Data
US 2022/0056863 A1  Feb. 24, 2022

(30) Foreign Application Priority Data
Aug. 19, 2020  (JP) ................. 2020-138493

(51) Int. Cl.
| | |
|---|---|
| F02D 41/20 | (2006.01) |
| H01F 7/18 | (2006.01) |
| G01R 31/72 | (2020.01) |
| G01R 31/28 | (2006.01) |

(52) U.S. Cl.
CPC .............. *F02D 41/20* (2013.01); *H01F 7/18* (2013.01); *F02D 2041/2027* (2013.01); *F02D 2041/2055* (2013.01); *G01R 31/2829* (2013.01); *G01R 31/72* (2020.01)

(58) Field of Classification Search
CPC ........................ F02D 2041/2017; G01R 31/72
See application file for complete search history.

(56) References Cited

U.S. PATENT DOCUMENTS

| | | | | |
|---|---|---|---|---|
| 4,729,056 A | * | 3/1988 | Edwards | ................. F02D 41/20 361/194 |
| 4,953,056 A | | 8/1990 | Yakuwa et al. | |
| 5,202,813 A | * | 4/1993 | Uota | .................... G05D 7/0635 700/282 |

FOREIGN PATENT DOCUMENTS

| | | |
|---|---|---|
| JP | S63175905 A | 7/1988 |
| JP | S63263705 A | 10/1988 |

* cited by examiner

*Primary Examiner* — Adolf D Berhane
*Assistant Examiner* — Afework S Demisse
(74) *Attorney, Agent, or Firm* — BUCHANAN INGERSOLL & ROONEY PC

(57) ABSTRACT

An electric current detection apparatus, the electric current detection apparatus is configured to detect an electric current flowing in a solenoid configured to be electrified by a PWM control, the apparatus includes a switch, an electric current value detection portion configured to detect a first electric current value at a first timing corresponding to a timing when the switch transitions from a closed state to an open state, the electric current value detection portion being configured to detect a third electric current value at a third timing, and a second electric current value calculation portion configured to calculate a second electric current value on the basis of the first electric current value and the third electric current value, the second electric current value being an electric current value of the electric current at the second timing.

8 Claims, 2 Drawing Sheets

ELECTRIC CURRENT DETECTION APPARATUS

CROSS REFERENCE TO RELATED APPLICATIONS

This application is based on and claims priority under 35 U.S.C. § 119 to Japanese Patent Application 2020-138493, filed on Aug. 19, 2020, the entire content of which is incorporated herein by reference.

TECHNICAL FIELD

This disclosure generally relates to an electric current detection apparatus.

BACKGROUND DISCUSSION

A known device which electrifies a solenoid and controls an operation is conventionally used. At such a known solenoid, a PWM control may be performed in accordance with a control signal that changes periodically, for example. On the other hand, it is desired that an electric current value of an electric current flowing in the solenoid is appropriately measured in order to appropriately control the electrification of the solenoid and/or the operation of the device. In a case where the electric current flowing at the solenoid is controlled by the above-stated PWM control, however, the electric current value of the electric current may not be always measured. Accordingly, a technique has been studied for detecting the electric current value of such electric current (for example, JPS63-263705A).

For example, a known electric current value processing apparatus of an electromagnetic coil is disclosed in JPS63-263705A (which will be hereinafter referred to as Patent reference 1). The known electric current value processing apparatus is configured by including a pulse signal generator, driving means, electric current value detection means, and a sample and hold circuit. The pulse signal generator generates a predetermined rectangular wave and the driving means drives or actuates the electromagnetic coil in accordance with the rectangular wave. The electric current value detection means detects an electric current value flowing at the electromagnetic coil, and the sample and hold circuit processes output of the electric current value detection means in accordance with an output signal of edge detection means detecting an edge of the rectangular wave and detects the electric current value flowing in the electromagnetic coil.

The technique described in Patent reference 1 is configured such that the electric current value detection means is provided with an amplifier. For example, use of an inexpensive amplifier is conceivable from a standpoint of cost reduction, however, many of such inexpensive amplifiers include a low slew rate. At the amplifier including a low slew rate, a delay time of an output signal relative to an input signal is long, and accordingly there exists an issue that the electric current value may not be measured appropriately in a case where the electric current value is detected with a trigger corresponding to a rise and/or a fall of the signal.

A need thus exists for an electric current detection apparatus which is not susceptible to the drawback mentioned above.

SUMMARY

An electric current detection apparatus, the electric current detection apparatus being configured to detect an electric current flowing in a solenoid configured to be electrified by a PWM control, the electric current detection apparatus includes a switch configured to be switched from either one of an open state and a closed state to the other by the PWM control, an electric current value detection portion configured to detect a first electric current value, the first electric current value being an electric current value of the electric current at a first timing corresponding to a timing when the switch transitions from the closed state to the open state, the electric current value detection portion being configured to detect a third electric current value, the third electric current value being an electric current value of the electric current at a third timing, the third timing being a timing when a first time period has passed from a second timing corresponding to a timing at which the switch transitions from the open state to the closed state and which is immediately prior to the first timing, the third timing occurring between the second timing and the first timing, the first time period being set in advance, and a second electric current value calculation portion configured to calculate a second electric current value on the basis of the first electric current value and the third electric current value, the second electric current value being an electric current value of the electric current at the second timing.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

An electric current detection apparatus of an embodiment of the disclosure is configured to appropriately detect an electric current flowing at a solenoid energized or electrified by a PWM control. For example, the solenoid may be used as a power source of a device (a valve body of an electromagnetic valve, for example) that is driven or actuated to perform a reciprocating movement. The solenoid may be a known solenoid and thus a detailed explanation thereof will be omitted. An electric current detection apparatus 1 of the embodiment will be described hereunder.

Figure 1:
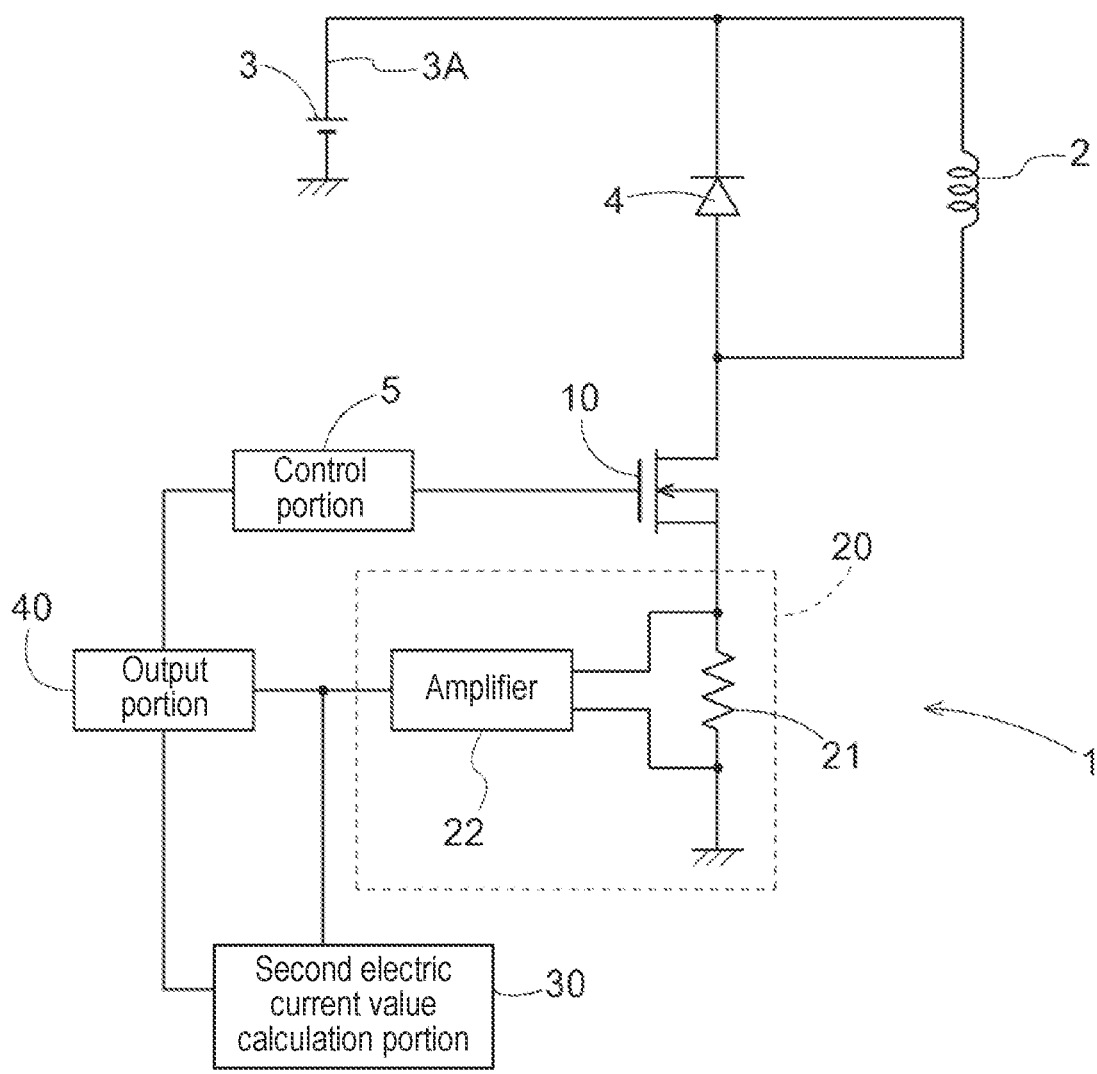
FIG. 1 is a schematic view illustrating a configuration of an electric current detection apparatus according to an embodiment disclosed here.

FIG. 1 is a block diagram schematically illustrating a configuration of the electric current detection apparatus 1. As illustrated in FIG. 1, the electric current detection apparatus 1 includes a switch 10, an electric current value detection portion 20, a second electric current value calculation portion 30 and an output portion 40. Each of the function portions is configured of hardware or software or both of them with a CPU serving as a core member, to perform processing related to measurement of an electric current value.

As illustrated in FIG. 1, a positive terminal 3A of a direct current power source 3 and a cathode terminal of a diode 4 are connected to one terminal of a solenoid 2. An anode terminal of the diode 4 is connected to another terminal of the solenoid 2. A drain terminal of an n-type MOS-FET or n-MOS-FET (an example of the switch 10) is connected to the anode terminal of the diode 4. One terminal of a resistor 21 (a shunt resistor) is connected to a source terminal of the n-type MOS-FET and another terminal of the resistor 21 is grounded. When the switch 10 is in a closed state, an electric current flows via the direct current power source 3, the solenoid 2, the switch 10 and the resistor 21. When the switch 10 is in an open state, an electric current caused by commutation flows in a closed circuit of the solenoid 2 and the diode 4.

The switch 10 is switched from one of the open state and the closed state to the other by the PWM control. As described above, the n-type MOS-FET is used as the switch 10 in the present embodiment. The closed state corresponds to an ON state of the n-type MOS-FET and the open state corresponds to an OFF state of the n-type MOS-FET. In the embodiment, a PWM signal is inputted from a control portion 5 to a gate terminal of the n-type MOS-FET, for driving. Accordingly, the n-type MOS-FET is switched from the ON state to the OFF state and switched from the OFF state to the ON state, by the PWM signal from the control portion 5.

In the present embodiment, the electric current value detection portion 20 is configured to include the resistor 21 and an amplifier 22. The PWM signal is shown in (A) of FIG. 2, a waveform of the electric current flowing in the solenoid 2 is shown in (B) of FIG. 2, and an output of the amplifier 22 is shown in (C) of FIG. 2. In the embodiment, the PWM signal including an on-duty ratio of 50% is shown in (A) of FIG. 2. Thus, the n-type MOS-FET is in the ON state from t1 to t2 and from t3 to t4, and is in the OFF state from t2 to t3 and from t4 to t5.

Figure 2:
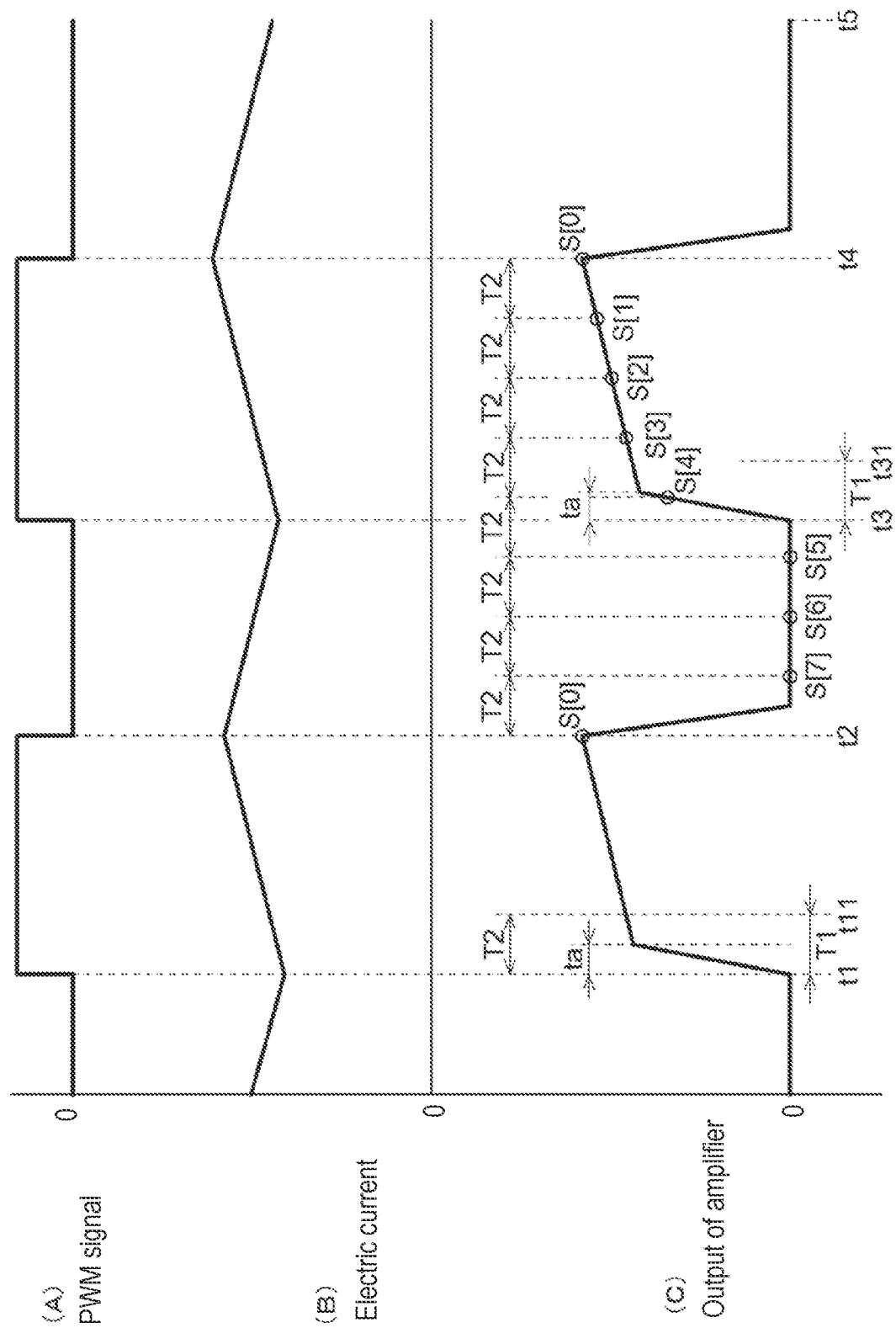
FIG. 2 is an explanatory view of each timing at the electric current detection apparatus of the embodiment.

When the PWM signal is inputted to the gate terminal of the n-type MOS-FET, the electric current flows to the solenoid 2 in such a manner that the electric current increases gradually in a case where the n-type MOS-FET is in the ON state and the electric current flows to the solenoid 2 in such a manner that the electric current decreases gradually in a case where the n-type MOS-FET is in the OFF state, as illustrated in (B) of FIG. 2.

Two input terminals of the amplifier 22 are connected to the one terminal and the another terminal of the resistor 21, respectively (refer to FIG. 1). Thus, when the n-type MOS-FET is in the ON state, the amplifier 22 is inputted with electric pressure attributed to the electric current flowing in the solenoid 2 and with ground potential. The amplifier 22 is inputted only with the ground potential when the n-type MOS-FET is in the OFF state. When such a signal (the potential) is inputted to the amplifier 22, a rise time and a fall time of the output of the amplifier 22 are longer than a rise time and a fall time of the PWM signal at the timings (t1, t3) at which the PWM signal rises and at the timings (t2, t4) at which the PWM signal falls, respectively, as shown in (C) of FIG. 2 depending on responsiveness (specifically, according to a slew rate) of the amplifier 22.

The electric current value detection portion 20 detects the electric current value of the electric current (a first electric current value) at a first timing corresponding to a timing at which the switch 10 transitions or moves from the closed state to the open state. The first timing that corresponds to the timing when the switch 10 transitions from the closed state to the open state is a timing at which the n-type MOS-FET transitions from the ON state to the OFF state, and the first timing is the timings t2 and t4 in the example shown in FIG. 2. This timing is referred to as the first timing at the electric current detection apparatus 1. The electric current value detection portion 20 detects the electric current value at the first timing, and the electric current value detected at the first timing is referred to as the first electric current value.

The electric current value detection portion 20 detects the electric current value of the electric current (a third electric current value) at a third timing. The third timing occurs between a second timing and the first timing. The second timing is a timing at which the switch 10 transitions from the open state to the closed state and which is immediately before the first timing. The third timing is a timing when a first time period T1, which is set in advance, has passed from the second timing. The timing at which the switch 10 transitions from the open state to the closed state and which is immediately before the first timing is a timing at which the n-type MOS-FET transitions from the OFF state to the ON state and which is immediately before the first timing (t2, t4), and the said timing at which the switch 10 transitions from the open state to the closed state and which is immediately before the first timing corresponds to t1 in a case where the first timing is t2 and corresponds to t3 in a case where the first timing is t4. The said timing is referred to as the second timing at the electric current detection apparatus 1. The third timing which occurs between the second timing and the first timing and at which the pre-set first time period T1 has passed from the second timing corresponds to a timing t11 which occurs between t1 and t2 and at which the pre-set first time period T1 has passed from t1 and a timing t31 which occurs between t3 and t4 and at which the pre-set first time period T1 has passed from t3.

Here, the first time period T1 is set to be shorter at least than a time period from t1 to t2 and than a time period from t3 to t4. The electric current value detection portion 20 detects the electric current value at the third timing and the electric current value detected at the third timing is referred to as the third electric current value.

A time period from the second timing to the next third timing is set to be longer than a delay time of an input-response-output of the amplifier 22. The time period from the second timing to the next third timing is a time period from t1 to t11 and a time period from t3 to t31, each of which corresponds to the first time period T1. The delay time of input response output of the amplifier 22 is a time period from the input of the signal into an input terminal of the amplifier 22 to the output of an intended signal from an output terminal of the amplifier 22, and the delay time is attributed to a response time of the amplifier 22. In the example of FIG. 2, ta corresponds to the delay time of the input response output of the amplifier 22. Accordingly, the first time period T1 is set to be longer than the delay time ta.

The above-described first electric current value corresponds to a peak value of the electric current in one period of the PWM control. The one period of the PWM control is a time period of one cycle of the PWM signal and is formed of one ON-DUTY and one OFF-DUTY. Accordingly, the peak value of the electric current in each period of the PWM control corresponds to the first electric current value.

In the present embodiment, the electric current value detection portion 20 detects an electric current value of the electric current at every second time period T2 during a period from a fourth timing to the first timing. The second time period T2 is set in advance. The fourth timing is a timing at which the switch 10 transitions from the closed state to the open state and which is immediately before the first timing. The fourth timing corresponds to the previous first timing. Consequently, in a case where the first timing is t4, the fourth timing at which the switch 10 transitions from the closed state to the open state and which is immediately prior to the first timing corresponds to t2. In the embodiment, the pre-set second time period T2 is ⅛ (one-eighth) of one period of the PWM control. Accordingly, in the embodiment, the electric current value detection portion 20 detects the electric current value of the electric current in a sampling period that corresponds to the one-eighth period.

The second electric current value calculation portion 30 calculates, as a second electric current value, the electric current value of the electric current at the second timing, on the basis of the first electric current value and the third electric current value. The first electric current value is the electric current value detected at the first timing, and the third electric current value is the electric current value detected at the third timing in the present embodiment as described above, and the electric current values are transmitted from the electric current value detection portion 20. The second timing is the timing at which the n-type MOS-FET transitions from the OFF state to the ON state. Consequently, the second electric current value calculation portion 30 calculates the electric current value of the timing of t1, which serves as the second electric current value, on the basis of the electric current value as of the timing of t11 and the electric current value of the timing as of t2. The second electric current value calculation portion 30 calculates the electric current value of the timing of t3, which serves as the second electric current value, on the basis of the electric current value as of the timing of t31 and the electric current value as of the timing of t4. That is, the electric current detection apparatus 1 of the embodiment calculates the electric current value of the timing at which the n-type MOS-FET transitions from the OFF state to the ON state by using the electric current values of the two timings at which the n-type MOS-FET is in the ON state. In a case where the sampling is performed in the above-described sampling period, the third timing and the sampling period may disagree with or mismatch each other (the relation between t31 and S[3] shown in FIG. 2, for example). In such a case, a value sampled after the third timing may be used.

Specifically, the second electric current value calculation portion 30 calculates the second electric current value in accordance with the following expression (1).

[Mathematical Expression 1]

$$VL = VH - \frac{T}{T-T1}(VH - VL') \quad (1)$$

Here, VL is the electric current value of the electric current at the second timing, VH is the electric current value of the electric current detected at the first timing, T is the time period during the ON-DUTY, VL' is the electric current value of the electric current detected at the third timing, and T1 is the time period from the second timing to the third timing.

As described above, the electric current value of the electric current at the second timing is calculated appropriately on the basis of the electric current value of the electric current detected at the first timing and the electric current value of the electric current detected at the third timing, without being influenced by the delay time of the amplifier 22.

In a case where the electric current value is detected in a configuration where the second time period T2 is the sampling period, the following applies.

[Mathematical Expression 2]

$$n = \text{integer}\left(\frac{T-T1}{T2}\right) \quad (2)$$

Here, integer is a function that truncates or rounds off after the decimal point and has an integral value as a parameter or argument. However, note that T−T1>T2.

Where VH=S[0], VL'=S[n] (n is a natural number from 1 to 7), the VL is calculated as follows.

[Mathematical Expression 3]

$$VL = S[0] - \frac{T}{n \times T2}(S[0] - S[n]) \quad (3)$$

Thus, the electric current value of the electric current at the second timing is calculated appropriately while a load related to the detection of the electric current value is reduced.

The output portion 40 outputs the first electric current value serving as the electric current value of the electric current of the first timing, and outputs the second electric current value serving as the electric current value of the electric current of the second timing. In the present embodiment, the output portion 40 outputs the first electric current value and the second electric current value to the control portion 5. At the control portion 5, an average electric current I is calculated from an expression (4), on the basis of the first electric current value VH and the second electric current value VL.

[Mathematical Expression 4]

$$I = k\frac{VH + VL}{2} \quad (4)$$

(Note that k is a predetermined constant number.) Accordingly, the control portion 5 is allowed to appropriately detect the electric current value of the electric current of the solenoid 2 electrified by the PWM control, and to appropriately control the actuation of the solenoid 2.

Other embodiments disclosed here will be explained. In the above-described embodiment, the switch 10 is the n-type MOS-FET, however, the switch 10 may be a p-type MOS-FET or other switch.

In the aforementioned embodiment, the electric current value detection portion 20 detects the electric current value of the electric current at every second time period T2 during the period from the fourth timing, the fourth timing corresponding to the timing at which the switch 10 transitions from the closed state to the open state and which is immediately prior to the first timing, up to the first timing. However, the electric current value detection portion 20 may be configured to detect an electric current value of the electric current only at a predetermined timing (at the third timing, for example). In the above-described embodiment, the example is explained where the number of times of the sampling of the electric current value detection portion 20 is eight during the period from the fourth timing, the fourth timing corresponding to the timing at which the switch 10 transitions from the closed state to the open state immediately prior to the first timing, to the first timing. However, the number of times at which the sampling is performed may be seven times or less, or nine times or more.

In the above-described embodiment, the first time period T1 is explained as the time period in which one sampling period passes or elapses from the second timing, however, the first time period T1 may be a time period in which two or more sampling periods pass from the second timing. However, the apparatus may be configure not to include the sampling period of one in which the sampling is performed once in one period of the PWM period.

In the above-described embodiment, the first electric current value corresponds to the peak value of the electric current in one period of the PWM control, however, the first electric current value may not be the peak value. In such a case, it may be configured that the electric current value detection portion 20 detects the peak value in other manner.

In the above-described embodiment, the electric current value detection portion 20 is configured to include the resistor 21 and the amplifier 22, however, the electric current value detection portion 20 may include other configuration than the above-described embodiment.

In the above-described embodiment, the second timing t3 and the sampling point do not coincide with each other. However, in a case where the second timing t3 and a sampling point S[4] coincide with each other including in a case of the on-duty ratio of 50%, the electric current value detection portion 20 may regard the sampling point S[4] as the next sampling, regard a sampling point S[3] as the following sampling point, and detect an electric current value at the sampling point S[3] as the third electric current value.

The present disclosure is applicable to an electric current detection apparatus that detects an electric current flowing in a solenoid energized or electrified under a PWM control.

According to the aforementioned embodiment, the electric current detection apparatus 1 is configured to detect the electric current flowing to the solenoid 2 configured to be electrified by the PWM control. The electric current detection apparatus 1 includes the switch 10 configured to be switched from either one of the open state and the closed state to the other by the PWM control. The apparatus includes the electric current value detection portion 20 configured to detect the first electric current value, the first electric current value being the electric current value of the electric current at the first timing t2, t4 corresponding to the timing when the switch 10 transitions from the closed state to the open state, the electric current value detection portion 20 configured to detect the third electric current value, the third electric current value being the electric current value of the electric current at the third timing t11, t31, the third timing t11, t31 being the timing when the first time period T1 has passed from the second timing t1, t3 corresponding to the timing at which the switch 10 transitions from the open state to the closed state and which is immediately prior to the first timing t2, t4, the third timing t11, t31 occurring between the second timing t1, t3 and the first timing t2, t4, the first time period T1 being set in advance. The apparatus includes the second electric current value calculation portion 30 configured to calculate the second electric current value on the basis of the first electric current value and the third electric current value, the second electric current value being the electric current value of the electric current at the second timing t1, t3.

According to the above-described configuration, the second electric current value is calculated in accordance with the first electric current value and the third electric current value. Consequently, the electric current value at each of the timings can be detected or obtained with a high accuracy.

According to the aforementioned embodiment, the electric current value detection portion 20 detects the electric current value of the electric current at every second time period T2 during the period from the fourth timing to the first timing, and the fourth timing corresponds to the timing at which the switch 10 transitions from the closed state to the open state and which is immediately prior to the first timing, and the second time period T2 is set in advance.

According to the above-described configuration, the processing load of the electric current detection apparatus 1 is prevented from increasing even in a case where the solenoid is provided in a multistage configuration.

According to the aforementioned embodiment, the first electric current value corresponds to the peak value of the electric current in one cycle of the PWM control.

According to the above-described configuration, the detection of the first electric current value can be performed easily.

According to the aforementioned embodiment, the electric current value detection portion 20 includes the amplifier 22, and the time period from the second timing t1, t3 to the next third timing t11, t31 is set to be longer than the delay time to of the input response output of the amplifier 22.

According to the above-described configuration, the accuracy of the electric current detection is maintained even if the influence of the delay time occurs in a case where the inexpensive amplifier is used. Consequently, the electric current value of the electric current is detected appropriately and a contribution to the cost reduction may be made.

The principles, preferred embodiments and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. An electric current detection apparatus, the electric current detection apparatus being configured to detect an electric current flowing in a solenoid configured to be electrified by a PWM control, the electric current detection apparatus comprising:
   a switch configured to be switched from either one of an open state and a closed state to the other by the PWM control;
   an electric current value detection portion configured to detect a first electric current value, the first electric current value being an electric current value of the electric current at a first timing corresponding to a timing when the switch transitions from the closed state to the open state;
   the electric current value detection portion configured to detect a third electric current value, the third electric current value being an electric current value of the electric current at a third timing, the third timing being a timing when a first time period has passed from a second timing corresponding to a timing at which the switch transitions from the open state to the closed state and which is immediately prior to the first timing, the third timing occurring between the second timing and the first timing, the first time period being set in advance; and
   a second electric current value calculation portion configured to calculate a second electric current value on the basis of the first electric current value and the third electric current value, the second electric current value being an electric current value of the electric current at the second timing.

2. The electric current detection apparatus according to claim 1, wherein the electric current value detection portion detects an electric current value of the electric current at every second time period during a period from a fourth timing to the first timing, the fourth timing corresponds to a timing at which the switch transitions from the closed state to the open state and which is immediately prior to the first timing, and the second time period is set in advance.

3. The electric current detection apparatus according to claim 2, wherein the first electric current value corresponds to a peak value of an electric current in one cycle of the PWM control.

4. The electric current detection apparatus according to claim 3, wherein
the electric current value detection portion includes an amplifier, and
a time period from the second timing to the next third timing is set to be longer than a delay time of an input response output of the amplifier.

5. The electric current detection apparatus according to claim 2, wherein
the electric current value detection portion includes an amplifier, and
a time period from the second timing to the next third timing is set to be longer than a delay time of an input response output of the amplifier.

6. The electric current detection apparatus according to claim 1, wherein the first electric current value corresponds to a peak value of an electric current in one cycle of the PWM control.

7. The electric current detection apparatus according to claim 6, wherein
the electric current value detection portion includes an amplifier, and
a time period from the second timing to the next third timing is set to be longer than a delay time of an input response output of the amplifier.

8. The electric current detection apparatus according to claim 1, wherein
the electric current value detection portion includes an amplifier, and
a time period from the second timing to the next third timing is set to be longer than a delay time of an input response output of the amplifier.

* * * * *